United States Patent [19]

Fernandes

[11] Patent Number: 4,801,937
[45] Date of Patent: Jan. 31, 1989

[54] LINE MOUNTED APPARATUS FOR REMOTE MEASUREMENT OF POWER SYSTEM OR ENVIRONMENTAL PARAMETERS BEYOND LINE-OF-SITE DISTANC

[76] Inventor: Roosevelt A. Fernandes, 104 Ruby Rd., Liverpool, N.Y. 13088

[21] Appl. No.: 874,520

[22] Filed: Jun. 16, 1986

[51] Int. Cl.$^4$ .............................................. G08B 21/00
[52] U.S. Cl. ......................... 340/870.16; 340/870.17; 324/127; 323/357; 374/152
[58] Field of Search ..................... 340/870.16, 870.17; 455/12, 13; 350/96.20; 324/127, 129, 105, 117 R, 149; 323/357; 374/152

[56] References Cited

U.S. PATENT DOCUMENTS

| | | | |
|---|---|---|---|
| 3,428,896 | 2/1969 | Schweitzer | 324/126 |
| 4,359,262 | 11/1982 | Dolan | 350/96.20 |
| 4,384,289 | 5/1983 | Stillwell et al. | 340/870.17 |
| 4,428,645 | 1/1984 | Korbelak et al. | 350/96.20 |
| 4,611,207 | 9/1986 | Anderson et al. | 340/870.16 |
| 4,635,055 | 1/1987 | Fernandes et al. | 340/870.17 |

OTHER PUBLICATIONS

"The Post Office Experimental 14/11GHz OTS Earth Terminal" by P. S. J. Duffy, Natl. Electron Review, pp. 113-117.
"Intro. to Satellite TV Receiving Systems" by Martin Clifford; Electronic Servicing & Technology, Sep. 1984.
"A Novel Non-Geostationary Satellite Comm. System" by John M. Ruddy; IEEE, 1981.

Primary Examiner—John W. Caldwell, Sr.
Assistant Examiner—Tyrone Queen
Attorney, Agent, or Firm—Charles S. McGuire

[57] ABSTRACT

A remote sensing and communications system for installation on energized high voltage conductors is disclosed herein. The sensor modules are capable of measuring electrical, mechanical or environmental parameters in the vicinity of a high voltage conductor. The module digitizes and communicates the measured quantities via a communications subsystem mounted on and powered by an energized high voltage conductor without requiring a circuit interruption. Communications to a Central or Regional dispatch center at any desired distance from the sensing location is achieved using Ku-band or C-band spread spectrum satellite communications, or using the Geosynchronous Orbiting Environmental Satellites (GOES), or through fiber optic communications links.

Individual subsystem modules are generally toroidal in shape and can be mounted on an energized high voltage conductor using a hot-stick or other means. The energized conductor current flow and electromagnetic field is used to generate a regulated power supply for the sensor module electronics. All the electronic components within the unit are protected by a signal conditioning network to preclude destruction of components in the event of lightning strike or other overvoltage conditions.

16 Claims, 11 Drawing Sheets

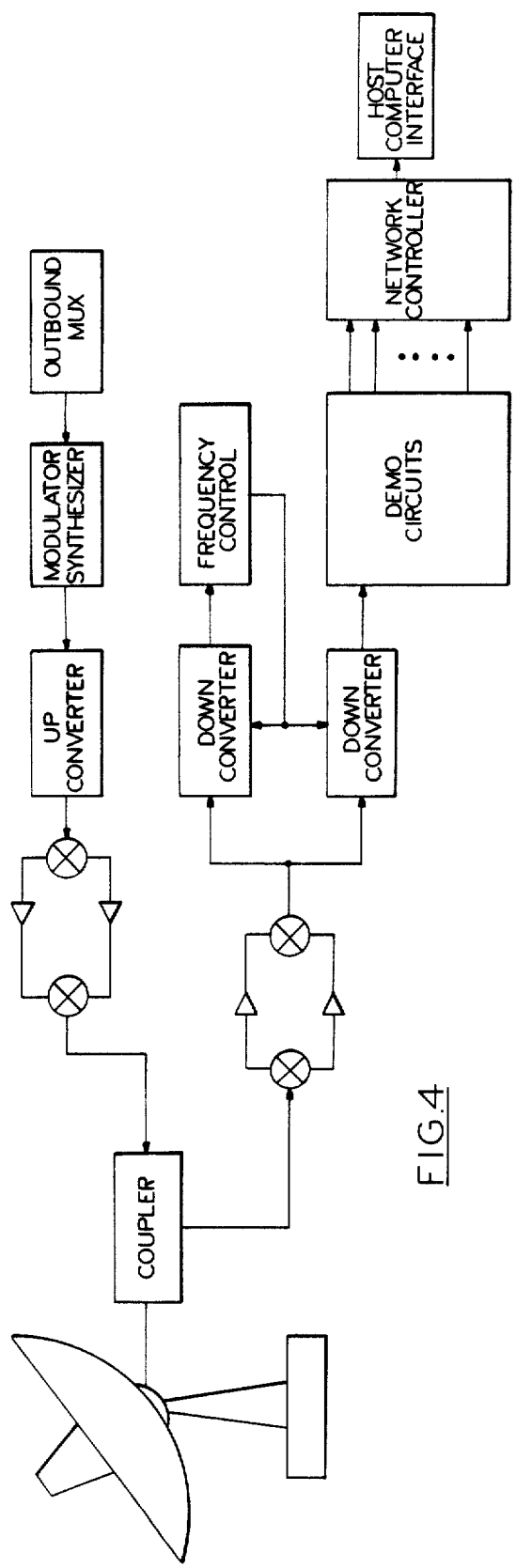
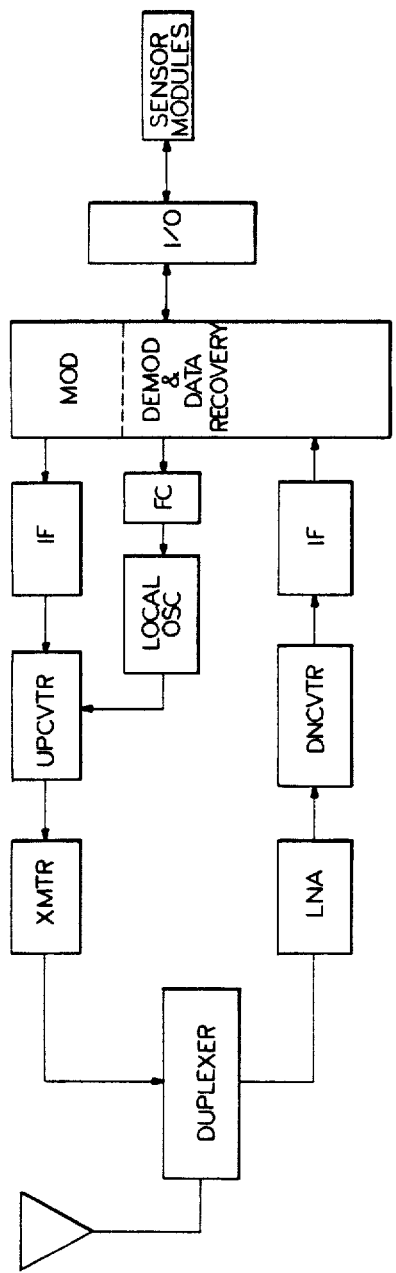
FIG.4
FIG.3

MODULE 16
DEMODULATOR, DATA RECOVERY
AND I/O ELECTRONICS

MODULE 30
POWER SUPPLY ELECTRONICS

LINE MOUNTED APPARATUS FOR REMOTE MEASUREMENT OF POWER SYSTEM OR ENVIRONMENTAL PARAMETERS BEYOND LINE-OF-SITE DISTANC

REFERENCE TO RELATED APPLICATIONS

This application is related U.S. Pat. No. 4,384,289 of Howard R. Stillwell and Roosevelt A. Fernandes entitled Transponder Unit For Measuring Temperature and Current On Live Transmission Lines, issued May 17, 1983, which patent is incorporated herein by reference; and to U.S. patent applications entitled System And Apparatus For Monitoring And Control Of A Bulk Electric Power Delivery System, Ser. No. 484,681 filed Apr. 13, 1983 now U.S. Pat. No. 4,689,752; Electrical Power Line And Substation Monitoring Apparatus And System Ser. No. 859,496, filed May 5, 1986; and Electrical Power Line Parameter Measurement Apparatus And Systems, Including Compact, Line-Mounted Modules, Ser. No. 859,497, filed May 5, 1986 now U.S. Pat. No. 4,709,339, which are also incorporated herein by reference.

BACKGROUND OF THE INVENTION

The present invention relates to apparatus for measuring and transmitting data commensurate with electrical, mechanical and/or environmental parameters in the immediate vicinity of a high voltage conductor, and more specifically to such apparatus which includes means for directly transmitting the data to a location an unlimited distance from the measuring location.

High power, AC, transmission line parameters have been typically measured by the use of step down isolation voltage transformers where one end of the primary high voltage winding was conductively coupled to the high voltage line. The existence of a direct conductive link between the high voltage passing through the power line and ground typically exposed the measuring equipment to high voltage stresses, especially when hit by lightning strikes. Exposure to such high voltage stresses necessitated bulky and therefore expensive construction of such voltage or current measuring equipment to assure reliable operation and operator safety over extended periods of time.

It is desirable to measure potential, current, phase angle, temperature and/or other powerline and environmental parameters at arbitrary positions along the power line for short periods or continually. These measured values can be used to derive Fourier frequency components, power, power factor and other information associated with the operation of a power system, and to locate and diagnose anomalies in the use and transmission of electric power. Various power line sensors for use in dynamic line rating of electrical power transmission lines have been disclosed in the prior art; for example, see U.S. Pat. Nos. 3,438,896, 3,633,191, 4,158,810 and 4,268,818. A line-mounted sensor module which comprises electronic components contained within a metallic enclosure surrounding the conductor, that measures, digitizes and transmits the actual instantaneous value of parameters such as voltage, current, phase angle, and temperature to a remote ground receiver using UHF/microwave radio communications is disclosed in the referenced related patent and prior applications. Such a configuration avoids requirements for bulky and costly insulation structures to isolate equipment at ground potential from the high voltage conductor. This was accomplished by the interposition of a radio link instead of the typical direct conductive connection to ground from the power line. However, this system requires the ground receiving station to be within, at most a few miles of the sensor modules and, at the 950 Mhz frequency, requires line-of-sight between transmitter and receiver. Besides the distance restrictions, the ground based equipment is subject to tampering and damage by various means. It also requires maintenance which may be difficult and expensive in remote locations.

OBJECTS OF THE INVENTION

It is therefore an object of the present invention to provide a hot-stick mountable, line-powered, high voltage transmission line monitor capable of measuring power line electrical, mechanical and/or environmental parameters at a first location and communicating signals indicative of the values of said parameters to remote locations an unlimited distance from the first location.

Another object of the invention is to eliminate the need for a remote ground station requiring power supply electronics and other auxiliary equipment and to provide a means for direct communication of sensor data to a remote, central power dispatch facility without the need for a separate, intermediate, ground-based station coupled to a telecommunications link.

Yet another object of the invention is to provide a means for hot-stick mounting a satellite communications antenna for transmitting remote sensor data via a C-Band, Ku-band or GOES (Geosynchronous Orbiting Environmental Satellite) to a central dispatch or data acquisition facility.

Still another object of the invention is to provide a means for remote data communications using fiber optic or infra-red (through the air) communications with the fiber-optic cable supported by hot-stick mountable supports which allow installation on an energized high voltage conductor, means for splicing and support of the fiber optic cable splice boxes, and means for powering and housing of repeater electronics when required for a long distance fiber-optic cable.

SUMMARY OF THE INVENTION

In accordance with the foregoing objects, the present invention contemplates a system providing data acquisition at one or more Central Dispatch Control or Regional Control Centers located hundreds or even thousands of miles from the conductor-mounted sensor modules. The latter are adapted to measure such parameters as transmission line current, voltage and phase angle, conductor temperature and other parameters, and operate in conjunction with modules that communicate the data to a remote site, such as a power dispatch center, using satellite, fiber optic, or infra-red communications links powered directly by one of the phases of a 3-phase high voltage line. All apparatus for sensing and communicating the information to a central dispatch center from remote sites is capable of being mounted on energized high voltage conductors by means of a so-called "hot stick", or by other hot-line installation means.

Each sensor module contains means for measuring one or more of the instantaneous parameters associated with controlling bulk power network flows, and/or mechanical and environmental parameters in the vicinity of a power conductor. The measured instantaneous quantities from each of the hot-stick mounted sensor modules can then be transmitted via a satellite, fiber-optic link or infra-red communications to a utility power control center or other location.

The novel invention disclosed herein makes possible the use of hot-stick mountable modules making up a complete monitoring and communication system. In one embodiment the system uses C-Band or Ku-Band satellite communications apparatus mounted on the energized high voltage power conductor with means for powering all the subsystem modules directly from the conductor with back-up rechargeable batteries.

The apparatus is disclosed for communications using conductor-mounted fiber-optic links. The fiber-optic repeater electronics and electro-optic terminal hardware is powered by the conductor line current. Segments of the fiber links may be spliced in conventional manner and the splices incorporated in modules which are hot-stick mounted on the power line conductor.

BRIEF DESCRIPTION OF THE DRAWINGS

FIG. 3 is a block diagram of a remote, spread spectrum Ku or C-band satellite communications system;

FIG. 4 is a partly diagrammatic block diagram of a master satellite earth station;

DETAILED DESCRIPTION

Figure 1:
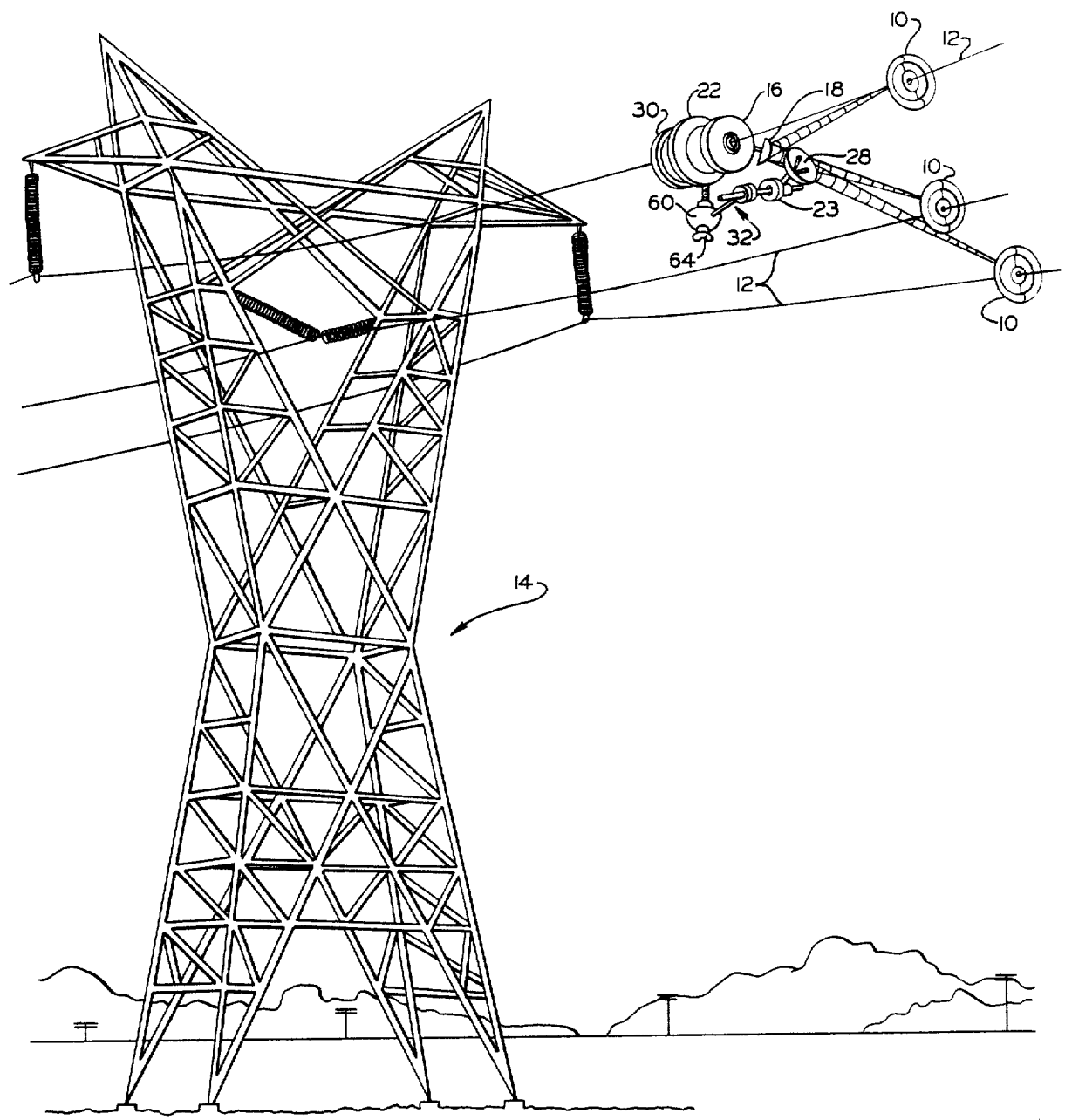
FIG. 1 is a perspective view showing a high voltage conductor mounted satellite micro-earth station of the present invention.

Referring now to the drawings, principal elements of the invention in a first embodiment are shown in FIG. 1, and are individually described later herein. Sensor modules 10 are mounted on existing, high voltage, AC power conductors 12 (one module on each conductor), which are supported in the usual manner on structural towers 14. As described in the related patent and applications, and as shown in more detail in FIG. 2, modules 10 include means for measuring and generating signals commensurate with various electrical, mechanical and/or environmental parameters associated with the electrical power carried by conductors 12 or present in their immediate vicinity. The signals generated by modules 10, which have no direct, conductive link between conductors 12 and ground, are communicated through milli-watt 928/952 Mhz transmitters from each conductor phase to I/O Data Recovery Demodulator subsystem module 16 through receiving antenna 18.

Signals from modules 10 are processed using a microprocessor based system in module 16 in a manner analagous to the ground receiving/support station described in the related patent and applications. Output digital data for the measured parameters, including processed quantities such as Megawatts (MW) and MegaVars (MVAR), are transferred from module 16 through an RF or fiber optic communication link to IF, Local Oscillator and Frequency Control Electronics module 22 of the communications subsystem. Module 30 produces 48 V DC power (FIG. 6) for the satellite communications controller electronics module 23 and the Up/Down Converter Electronics modules 24 and 26 (FIG. 5), mounted on the back of Ku-band or C-band spread spectrum satellite transmit/receive antenna 28. Module 30 also provides strip-heat power to keep the antenna free from snow and ice. Module 30 develops 5 V and 12 V DC power for electronic logic circuitry and other electronic subsystems in modules 22, 23, 24 and 26.

Modules 10, 16, 22, 23 and 30 are all of such structure and operation, both as disclosed in prior, related cases and more fully hereinafter, that they may be mounted upon conductors 12 by ground or bucket crews in suitable positions using so-called "hot stick" tools. This also applies to the mounting and positioning of antenna 28. One form of mechanism adapted to effect azimuth and elevation adjustment of antenna 28 is shown in FIG. 1, denoted generally by reference numeral 32, and will be described later in more detail. All of the heavy subsystems are modularized so that each component may be hot-stick mounted in the required manner. As described below, all of the power supply electronics are totally enclosed within the hot-stick mountable modules 16, 22 and 30 with module 30 developing a 48 V DC source to meet all of the satellite earth station electronic and auxiliary power requirements for full duplex communications via a Ku-band or C-band satellite using spread spectrum technology.

A block diagram of a typical data flow through the satellite communications system of the present invention is shown in FIG. 3. The only difference between the Ku-band and C-band satellite systems is in the RF circuitry. Ku-band satellites would also allow relatively small, e.g., 2 ft. diameter, satellite antennas for a 12 Ghz uplink. For illustrative purposes the following description of the block diagram is made with reference to a C-band satellite, such as Westar IV. Since all blocks in the diagram are labeled, no reference numerals are used.

The system comprises a 1.8 meter parabolic reflector antenna with a transmit frequency (uplink) of 5.925 to 6.425 Ghz and a receive frequency (downlink) of 3.7 to 4.2 Ghz. Receiver and transmitter sections of the satellite micro-earth station are duplexed together. Transmit and receive portions of the system contain an IF section. The system further includes microprocessor based demodulator and network controller with protocol conversion and I/O sections.

The receiver RF channel comprises a duplexer with low pass filter, low noise amplifier (LNA), downconverter and 70 Mhz IF sections. The LNA maintains a constant gain across the 3.7 to 4.2 Ghz band. The IF section contains a code-tracking and carrier tracking demodulator to recover data from the "despread" RF received signal. A microprocessor controls demodulator/data recovery circuitry. The microprocessor also uses a forward error correction algorithm for decoding received data and encoding transmitted data.

The transmit section comprises a 70 Mhz IF, frequency control synthesizer, an upconverter processor and power amplifier sections for a 1 watt RF power output at 6 Ghz. Interface with the sensor module signals is through the I/O processor sections. The processor buffers data and manages synchronous or asynchronous protocols depending on the interface requirements. The dish antenna is selected to meet FCC requirements for avoiding interference with adjacent satellites in geosynchronous orbit or with terrestrial microwave links. The antenna is also selected to provide sufficient gain for use with a 1 watt solid state power amplifier.

The micro-earth station transmits data, via satellite, to a Master Satellite Earth Station, colocated with the Central Power Dispatch facility associated with the power delivery system of which conductors 12 are a part. A block diagram for the Master Satellite Earth Station is shown in FIG. 4. The Master Earth Station utilizes a 7 meter parabolic reflector equipped with a dual polarized feed. This antenna feed contains a 4-port orthomode coupler to separate the 4-Ghz downlink from the 6 Ghz uplink for simultaneous horizontal and vertical polarization operation. All components of the block diagrams of FIGS. 3 and 4 are conventionally used in the illustrated applications and configurations, and are commerically available in standard form and/or may be custom constructed with present, state-of-the-art techniques.

Each of the subsystem modules shown in FIG. 1 are described in the following paragraphs using elements that are representative for purposes of disclosure of the invention.

Figure 2:
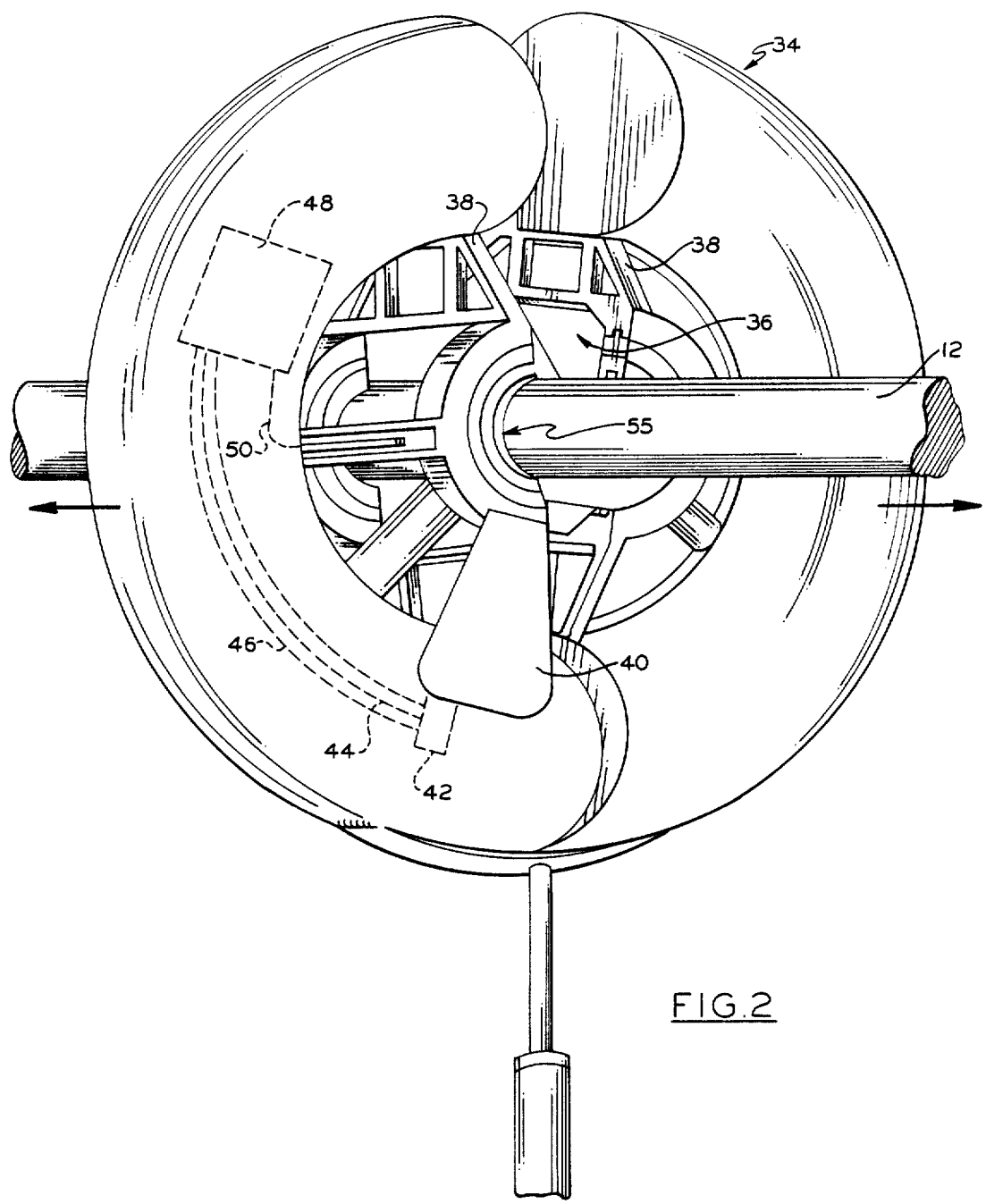
FIG. 2 is an enlarged perspective view of a high voltage sensor module shown in FIG. 1.

Referring now to FIG. 2, sensor module 10 is constructed in two, hinge-connected, half sections for movement between an open position, wherein it may be placed around one of conductors 12, and a closed position, wherein a central bore or opening through the center of the module tightly grips the conductor. Details of the hinge and locking mechanisms, although forming no part of the present invention, may correspond to those disclosed in prior application Ser. No. 484,681. Torroidal housing 34 is rigidly connected to hub assembly 36 by radial spokes 38. The opening defined by hub inserts in assembly 36, when in the closed position, has a diameter equal to that of the particular conductor 12 upon which module 10 is to be mounted. Typically, high voltage power conductors range from ¼" to 2½" in diameter, but may be more or less in some cases.

An RF impedance matching network 40 is mounted on module 10 near hub assembly 36, and is connected via associated coaxial cable parts 42, 44 and 46 to a shielded transmitter (not shown) and to electronics package 48 inside housing 34. Electronics package 48 is electrically coupled to conductor 12 by means of line 50, through the module hub assembly, as disclosed in copending application Ser. No. 859,496. The hub inserts 55 of module 10 and the other conductor-mounted modules (16, 22, 30) are preferably constructed of conductive, resilient, neoprene in order to prevent damage to the conductor and to absorb aeolian vibrations.

Figures 5, 5A:
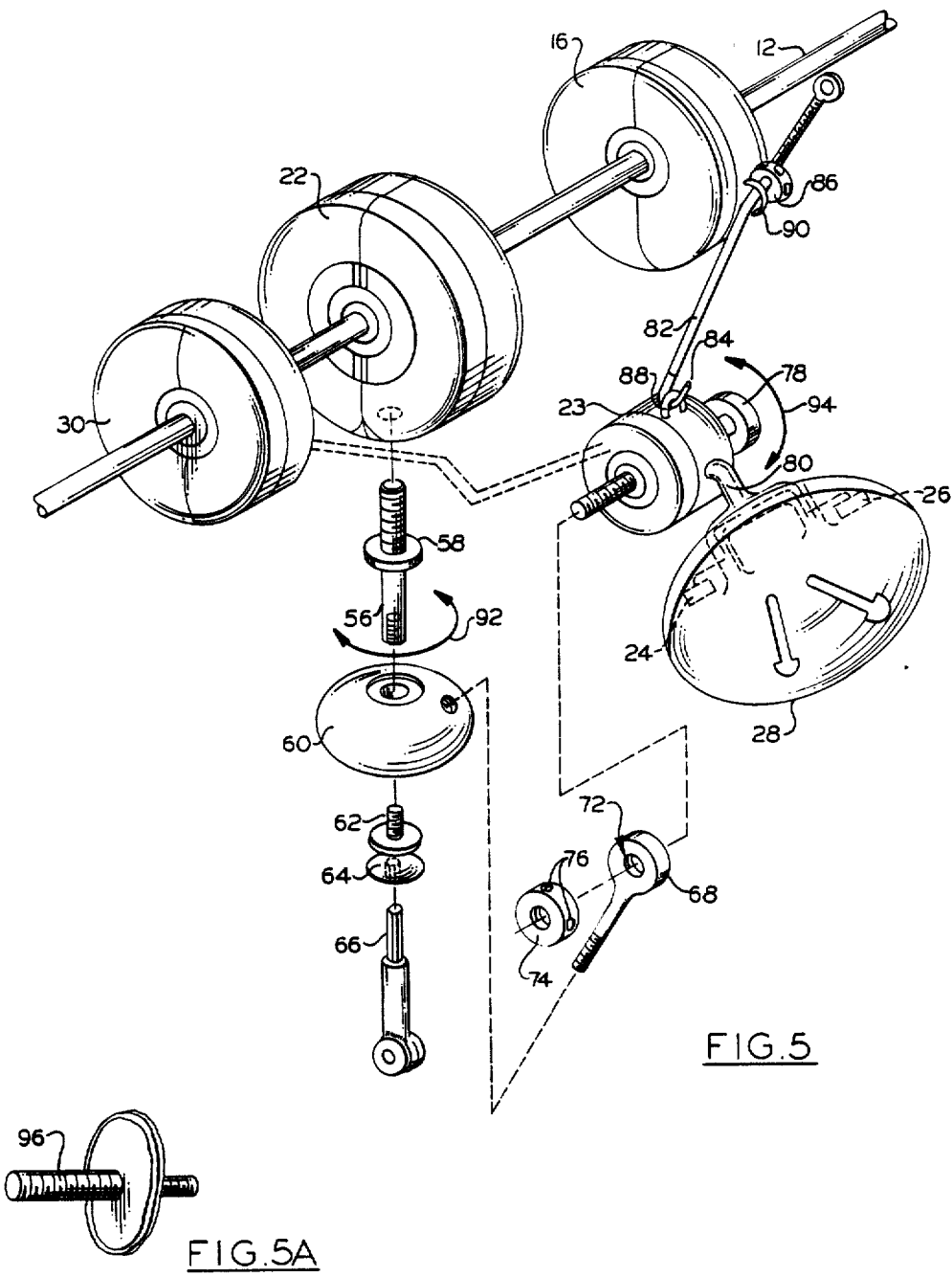
FIG. 5 is an enlarged, perspective view of the hot-stick mountable, conductor mounted satellite micro-earth station showing the elevation and azimuth adjustment means in conjunction with a Ku or C-band antenna.
FIG. 5a is a perspective view of a GOES satellite earth station antenna for alternate use in the system of FIG. 5 for transmitting environmental data.

Turning now to FIGS. 5, the mechanical details of module 22 and antenna 28, with the mounting and directional adjustment means for the latter, are shown. Hinged, toroidal modules 16, 22 and 30 are mounted on conductor 12 with a hot-stick and tool attachment as described in copending application Ser. No. 484,681. Shaft 56 is threaded at its upper end into a socket provided for such purpose in the lower side of module 22 and carries fixed collar or flange 58. Shaft 56 extends loosley through openings in the upper and lower sides of rounded member 60, and is internally threaded at its lower end to accept bolt 62 having rounded head 64 with a socket to accept hexagonal tip 66 of a tool attached to the end of a conventional hot sitck (not shown). The length of shaft 56 from flange 58 to the lower end is such that bolt 62 may be threaded into the lower end of shaft 56 to engage member 60 frictionally between flange 58 and bolt head 64 in a rotationally fixed position on shaft 56. Support member 68 is fixedly engaged at one end in a threaded opening in member 60. Shaft 70, threaded at both ends, extends through opening 72 in member 68 in loosley frictional engagement. Nut 74, having a series of hexagonally shaped sockets 76 in the periphery thereof, is threaded on the end of shaft 70 extending through support member 68, and integral flange 78 is positioned on the opposite end. Hinged, toroidal module 23 carries Y-shaped frame 80 upon which is mounted micro-earth station dish antenna 28. Module 23, with antenna 28 attached, is mounted from below on shaft 70 in the same manner that modules 16, 22 and 30 are mounted on conductor 12. Wiring connections from power supply module 30 to the electronics within module 23 are indicated diagrammatically by line 81 and those to the up and down converters 24 and 26 are carried through rubber grommeted holes in Y-shaped member 80. Alternatively, module 23 may have self-contained power supply means such as solar photovoltiac cells.

If desired, means may be provided to assist in supporting the weight of shaft 70 and the elements carried thereon, which should be no more than a few pounds. By way of example, there is shown flexible rod 82 having hook 84 on one end and collar 86 threaded on the other. Hook 84 engages eye 88 on module 23 and rod 82 passes through eye 90 on module 16 with collar 86 advanced on the threaded end of the rod as far as necessary to tension the rod. Rod 82 is preferably of fiberglass or other high strength, dielectric material.

With the elements so mounted, antenna 28 is positioned in the desired azimuth by rotation about shaft 56, as indicated by arrows 92. Bolt 62 is then advanced into shaft 56 by rotation of the hot stick tool engaged with bolt head 64 to engage member 60 in a non-rotatable position between flange 58 and bolt head 64. Antenna 28 is then moved to the desired elevation by rotating module 23 about shaft 70 (or by rotating the shaft and elements mounted thereon), as indicated by arrows 94. The elevational position of the antenna is fixed by rotating nut 74 with a hot stick tool until module 23 is tightly engaged between support member 68 and flange 78. It should also be noted that, instead of a C-band or Ku-band spread spectrum antenna, a compact, helical antenna about 18" long and less that 6" in diameter may be used for monitoring environmental parameters only, using a Geosynchronous Orbiting Environmental Satellite (GOES). FIG. 5a shows GOES antenna 96 mounted for elevation and azimuth adjustment in essentially the same manner as antenna 28 of FIGS. 1 and 5. The GOES RF modulation circuitry is mounted in module 23, and the commercially available Data Collection Platform I/O electronics is mounted in module 16.

The mechanical elements for supporting and adjusting the position of antenna 28 are, of course, only one of many possible embodiments of such structure. It is preferred that all elements be so configured and arranged that both mounting and positional adjustment of the antenna may be performed by crews manipulating hot stick tools with appropriate attachments. Antenna 28 is mounted as closely as practical to the point at which the conductor is supported to provide maximum stability.

Figure 6:
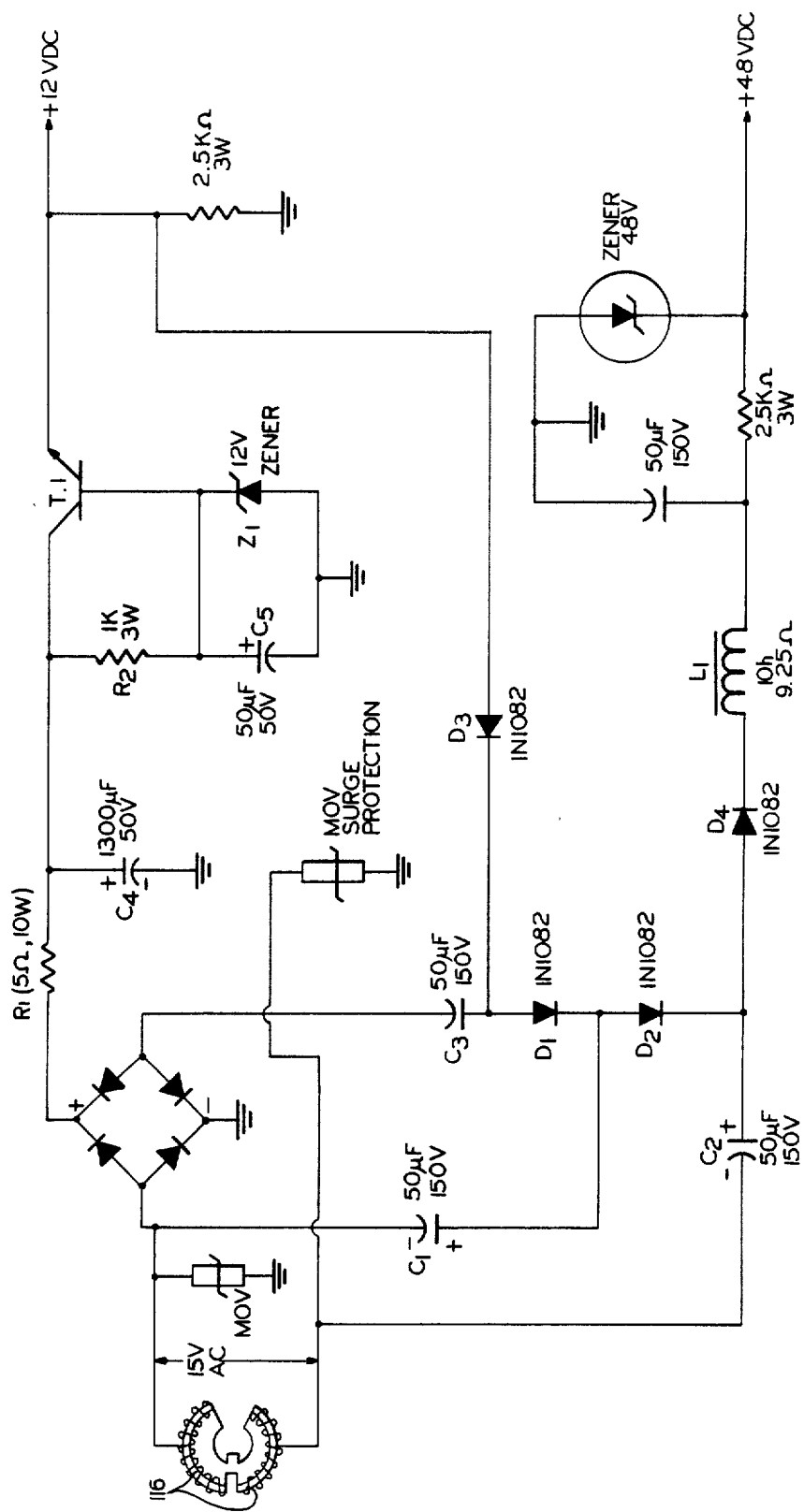
FIG. 6 is a schematic diagram of the DC power supply for the electronic circuitry of the micro-earth station.

The circuitry for deriving power from conductor 12 and supplying the proper DC voltages to the elements of the system is shown in FIG. 6. Each toroidal module 30 contains segmented toroidal transformer core and windings 116 connected in parallel coil configurations to form secondary windings with the high voltage power conductor forming the high current primary. The split toroidal core secondary windings connected in parallel are used to provide a 15 V AC secondary output shown in FIG. 6. A bridge rectifier is used to provide a DC output voltage which is passed through a standard voltage regulator circuit to provide a $+12$ V DC power supply for the electronic circuits connected to it within module 22, Up/Down converters 24 and 26 and the demodulator, data recovery I/O electronics. Capacitor C1, C2 and C3 couple positive half-cycles of the transformer secondary to multiplier diodes D1, D2, D3 and D4. Negative half cycles are clamped by the bridge rectifier. No-load voltage at the output of each stage of the multiplier is the DC output of the previous stage plus 1.4 times the rms voltage at the transformer secondary,. The output voltage, 48 VDC is determined by the number of multiplier stages and by the load current. A DC regulator controls the 48 VDC power supply for the satellite earth station controller electronics within modules 16, 22, 24, and 26. Examples of suitable types and values of circuit components are shown on the schematic.

Figure 7:
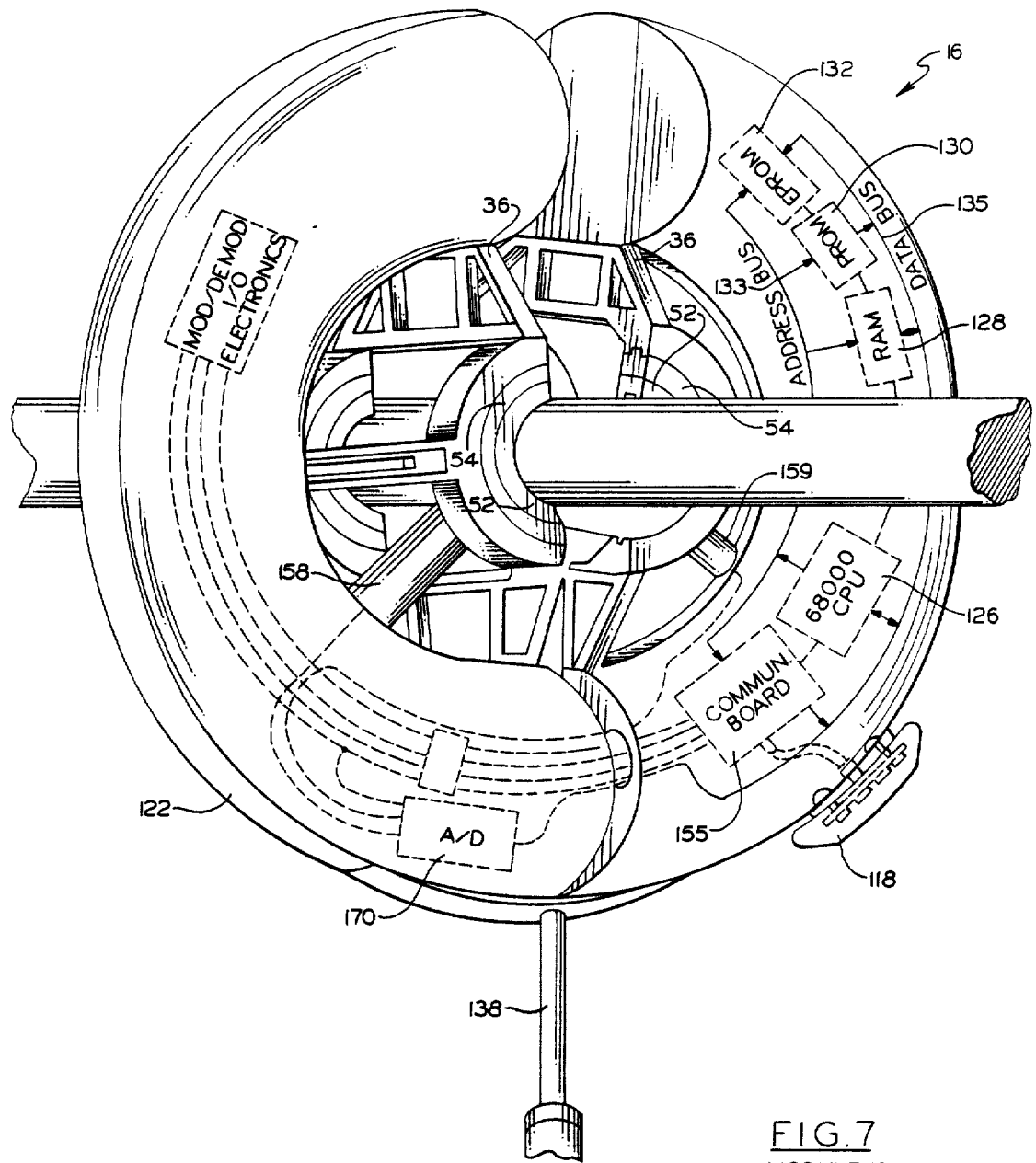
FIG. 7 is an enlarged, perspective view of the demodulator, data recovery and input/output electronics module.

The subsystem module 16, shown in further detail in FIG. 7, is hot-stick mountable and contains the Demodulator, Data Recovery and I/O electronics. It also contains a 928/952 Mhz RF receiving antenna 118 and all the electronics within it are powered from power supply derived from the line current. The I/O signals from module 16 are linked to module 22 through a data link. Toroidal housing 122 is formed in two hingedly connected segments similar to those discussed previously for module 10, and is mounted on conductor 12 in essentially the same manner with radial spokes 36 connecting housing 122 to movable hub assembly 36. Data received from the various sensor modules 10 is processed and transmitted to module 23 through an RS232 serial port on communication board 124. Module 16 is equipped with receiving antenna 118, communication board 124, CPU processor board 126, RAM 128, PROM board 130 and electronically eraseable PROM board 132. For maximum packing density multi-tiered circuit boards are used inside shielded compartments. Care is taken to avoid any 60 hz short circuit loops. Address bus 133 and data bus 135 interconnect the circuit cards. Receiving antenna 118 receives data from other sensor modules communicating at 928/952 Mhz, in a manner similar to the ground support station disclosed in previously referenced applications. This information is already in digital form.

Figure 8:
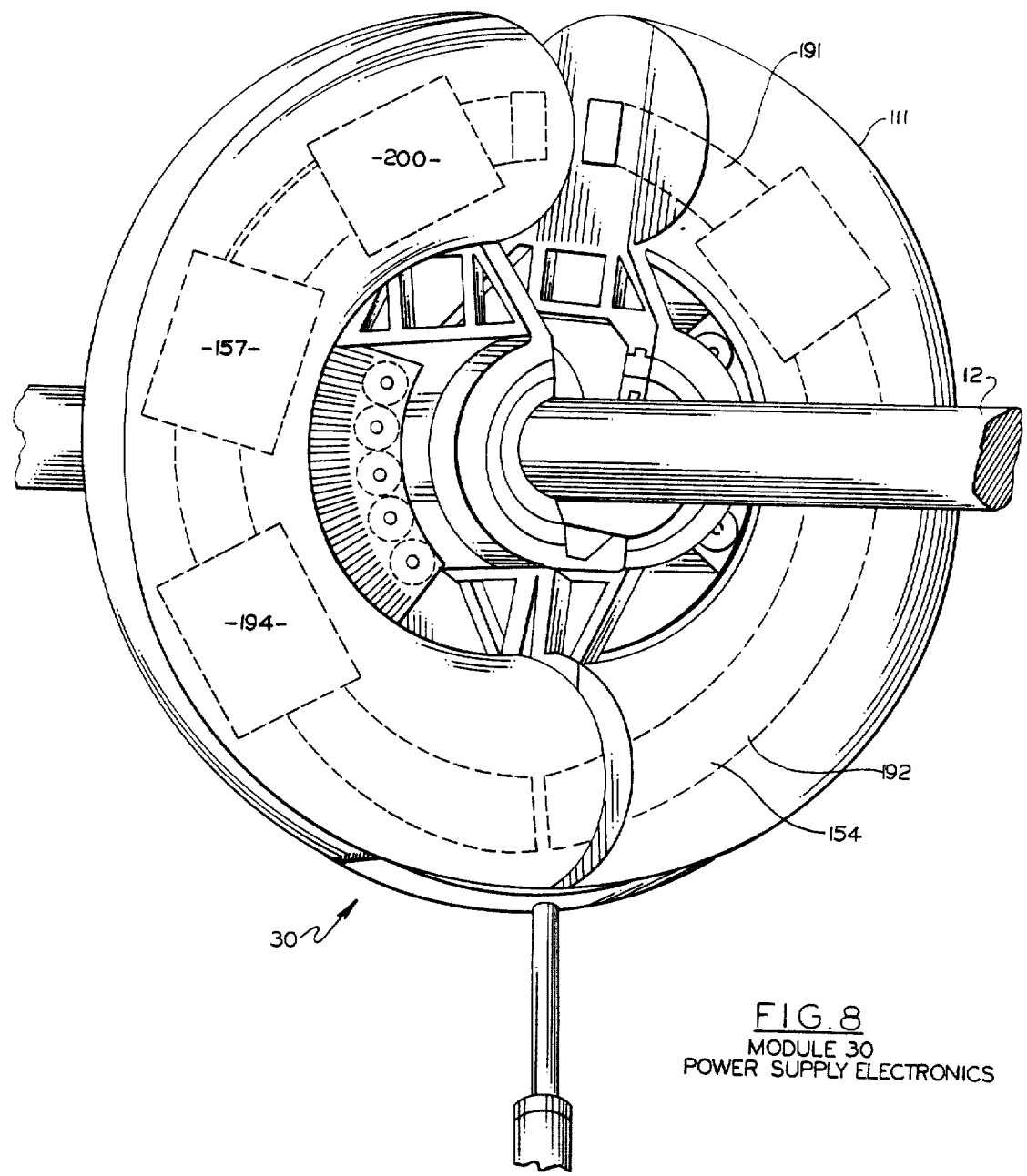
FIG. 8 is an enlarged, perspective view of the power supply electronics module of FIG. 1.

Module 30 houses power supply electronics for modulator/demodulator, data recovery and I/O electronics module 16. A perspective view of module 30 is shown in FIG. 8. A hinged, iron core transformer configuration 154, similar to the hinged, core power supply of module 10 is used. In order to house a large number of turns and heavier core, multiple windings are used around each half of the hinged, iron core with an adequate gap left in the vicinity of the hinge mechanism. In order to have a backup power supply during periods of low (below 20 amperes) or zero line current, the area between the hub and inside of the torus is enclosed and carries D size, rechargeable battery cells 156 in a series-parallel arrangement using both halves of the housing in a symmetrical arrangement around the hub.

The electronic circuitry for the DC power supply, regulator and battery charger is shown in previously referenced application Ser. No. 859,496. Instead of the disclosed system of satellite communications for transmitting signals commensurate with the measured parameters over essentially unlimited distances, other types of communication may be employed. For example, the measurement and transmission techniques of the invention may be applied to fiber optic systems of the type currently in use for transmitting data between locations communicating through fiber optic links. An example of such a fiber optic system for transmitting signals commensurate with parameters sensed by modules 10, constructed and operated as in the previous embodiment, is illustrated in FIGS. 9–12. It is also contemplated within the framework of the invention, that fiber optic cables supported upon high voltage conductors and deriving therefrom power for the electronics associated with fiber optic communications may be utilized to transmit optical data of any type from point-to-point; that is, the data need not necessarily be received from sensor modules or otherwise associated with parameters of the conductor. The power for the optical repeater electronics which boost the optical signals at selected locations is derived in the manner previously described by the power supply modules (30) mounted upon the energized conductors with hot stick tools, or otherwise.

Data from line powered sensor modules 10 is radio-transmitted to module 16 containing the previously described circuitry for processing the 928/952 Mhz RF signals. The serial data stream is connected via a fiber-optic link 163 to module 160 which contains the opto-electronic processing circuitry. In FIG. 10, incoming, optically coded data from preceding sensing positions on conductors 12 is received at module 160 through optical fiber 162, converted by Avalanche Photo Diode 164 to an electronic signal which is amplified by amplifier 166, and passed to digital filter 168 and thence to AGC circuitry 170. The serial data stream then passes through level detect 172 and bit synchronization circuitry 174, and is multiplexed in MUX176 with the digital data stream from module 16. The multiplexed electronic signals in the form of a Pulse Code Modulated serial data stream is converted to a corresponding string of optical digital data pulses through standard injection laser diode driver circuitry 178 and laser diodes 186. Photodiode feedback circuitry 182 and bias stabilization electronics 184 provide the optical transmissions 188 that are injected into the fiber optic cable 163 in FIG. 9 for transmission to the central data collection facility an unlimited distance from the sensing modules. In applications wherein data is transmitted along an optical fiber link supported by a power conductor without inputs from line-mounted sensor modules, optical cable 163 may be omitted and the other components of FIG. 10 remain the same.

Figure 9:
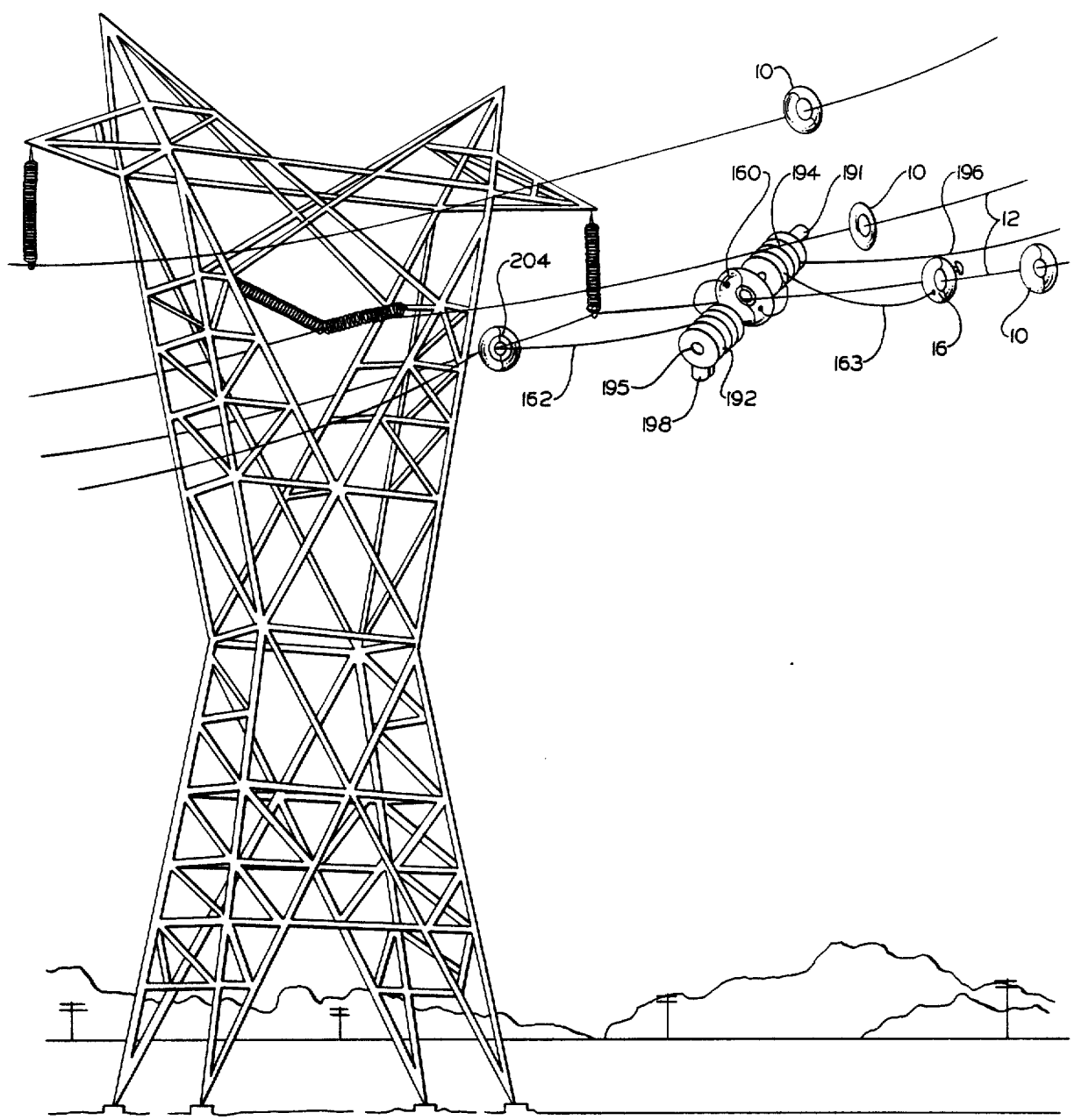
FIG. 9 is a perspective view of a high voltage conductor mounted monitoring system using a fiber optics communication link.
Figure 10:
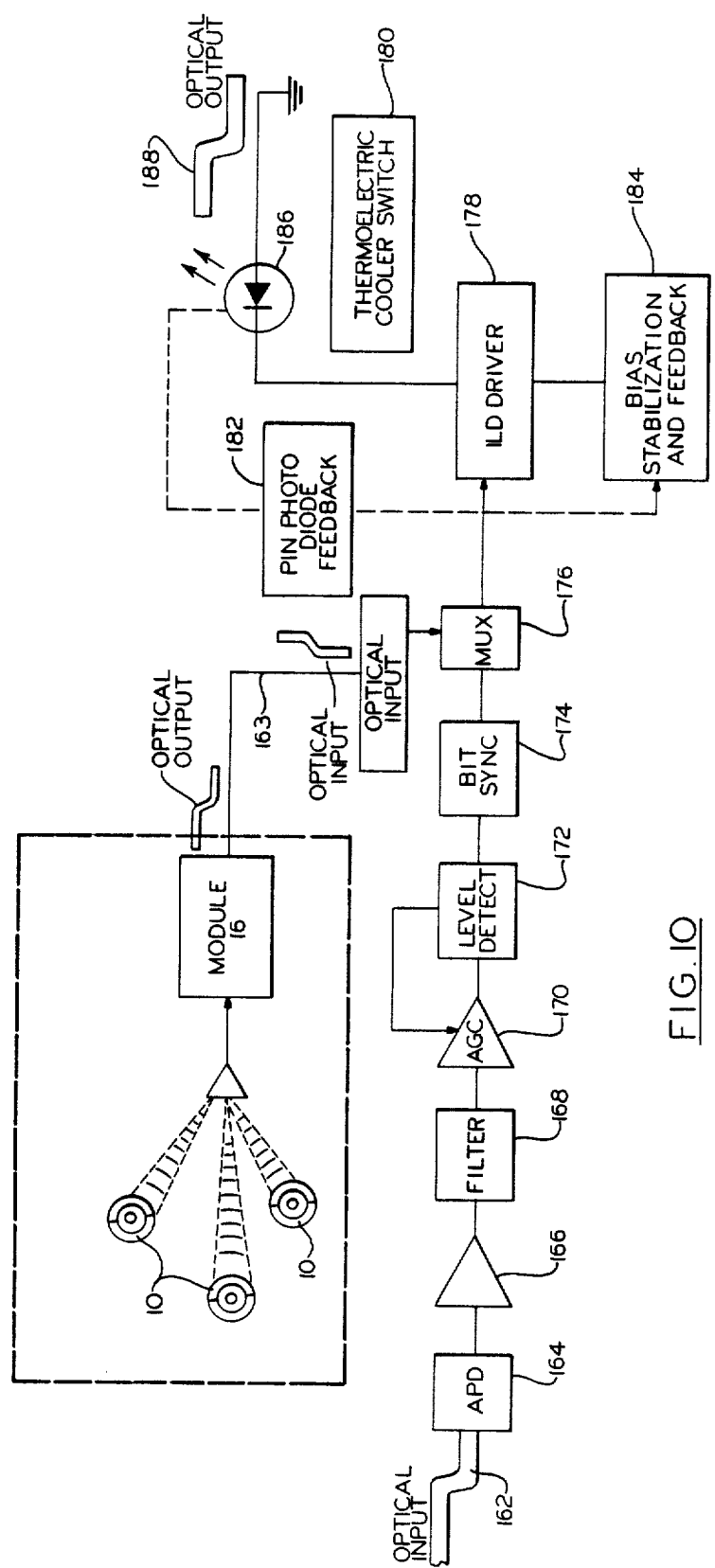
FIG. 10 is a block diagram of the line powered fiber optics communication electronic circuitry of FIG. 9.
Figure 11:
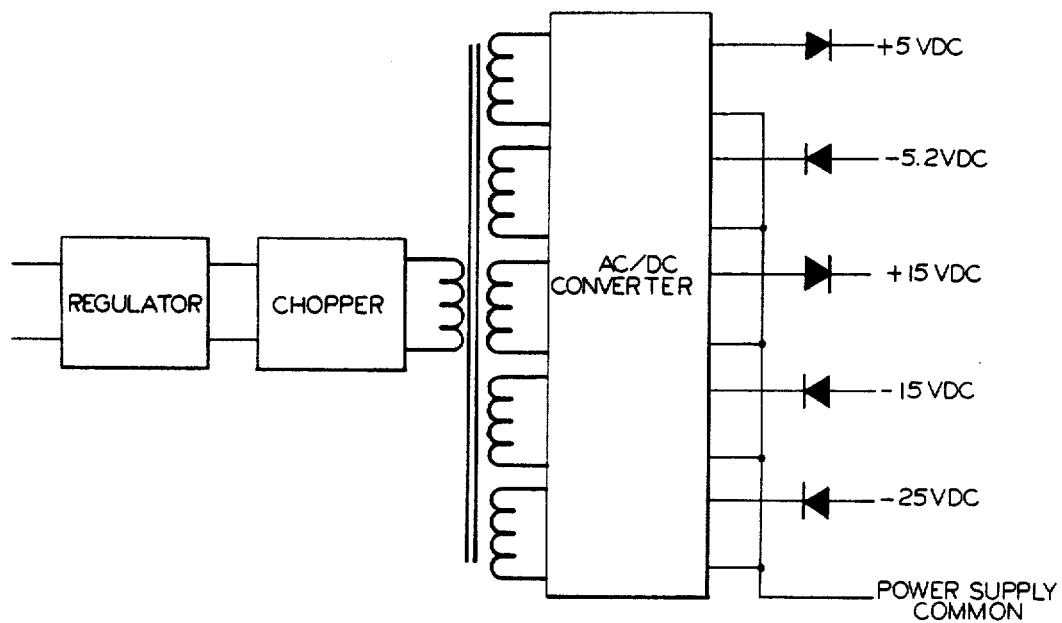
FIG. 11 is a schematic diagram of the power supply for the fiber optics communication circuitry of FIG. 12.

In the FIG. 9 embodiment, modules 10, 16, 160 and 204 are all of the hinged, split-toroidal, hot-stick mountable type previously described. Module 160 serves as a means of supporting fiber optic spools 192 and 194 which serve to take-up enough fiber optic cable, from the incoming 162 and outgoing 196 fiber optic cable sections, so that the interconnections in module 160 can be made by bringing the module with the take-up spools down into an insulated bucket truck. This allows all the fiber optic terminations to be made at eye level in an insulated bucket truck. Spools 192 and 194 rotate on shafts 195 and 197 and can be locked in place with a hot-stick tool engaging eyelet 198. Module 16 converts the digital data from modules 10 to optical signals for transmission to module 160 through fiber optic link 163. In module 160 the optical signals are converted to electronic signals before being multiplexed. The power supply for module 160 is derived from the regulated 48 Vdc power supply of FIG. 11 through a solid state chopper circuit with common magnetics and an AC/DC converter allowing a range of DC voltages for the various electronic circuits within module 160.

Figure 12:
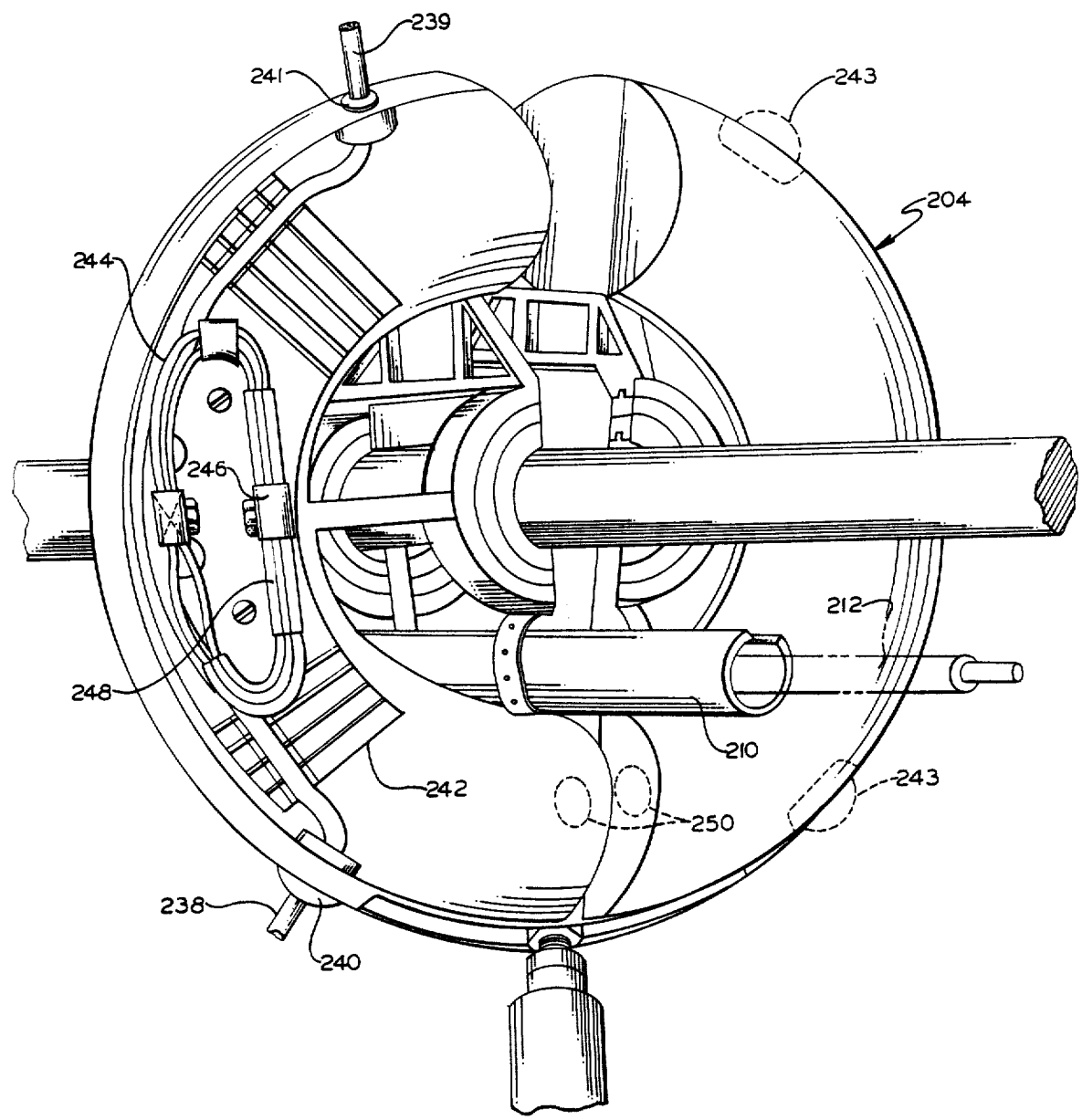
FIG. 12 is a perspective view of a hot-stick mountable splice box and fiber optic cable support module.

Modules 204, shown in FIG. 12, are used to support the fiber optic cable or cable splice connections and do not contain electronics, transmitters, or the like. They may be of simpler construction than the other modules, having either aluminum or high strength plastic housings, and are of the hinged toroidal construction for mounting on conductors 12. A fiber optic cable tray 210 is mounted in the open spoke or web area of the toroidal housing. The fiber optic cable 212, shown in phantom lines in FIG. 12, is passed through the module and, when the module is closed around the conductor, cable 212 is trapped within the space below the mounting hubs. Modules 204 can also be used as splice enclosures for connecting separate fiber optic cable segments. Fiber optic cables are generally manufactured in lengths of 2 km. For long distance applications several splices have to be made. The fiber optic cable segments 238 and 239 to be spliced are brought into the housing through sealed housing inserts 240 and 241. The cables are routed through a plastic splice guide 242 after being cut and stripped in the usual manner. The individual fibers in their buffer tubes 244 are then routed within the molded plastic guide so that the fibers to be fusion spliced are lined up in the support holder 246, where the fibers from each cable segment are lined up after stripping back the buffer tubes 244. The fibers are fusion spliced in the usual manner immersed in a gel and then encapsulated in an epoxy type material by placing the mating cover of the splice guide 242 over the bottom portion and snapping the guide case shut. Each spliced fiber, after fusion splicing, is protected in rigid tubular sleeves 248 which are slipped on prior to completing the fusion splices. The module 204 cast aluminum or plastic covers are then bolted to the bottom half of the housing and then mounted on the conductor 12 using the techniques described in copending applications. Additional fiber optic cable moisture proof entry ports 243 are provided for drop and insert T-junction points. Interconnection between module halves is provided through cable ports at the cover end faces 250 above the hinge mechanism.

It is thus seen that the power line sensor modules described herein can be used with great flexibility using satellite and fiber-optic remote communications to carry data an unlimited distance away from the sensor modules.

What is claimed is:

1. A system for measuring the value of at least one electrical, mechanical or environmental parameter associated with or in the immediate vicinity of an overhead power conductor carrying a high voltage potential, at a first location, for transmitting a signal commensurate with said value to a second location beyond line-of-sight distance from said first location, said system comprising:
 (a) at least one sensing module mounted upon and at the voltage potential of, an energized power conductor at said first location;
 (b) transducer and power supply means mounted to said sensing module for measuring said parameter value;
 (c) first signal transmitting means mounted to said sensing module for transmitting a first signal commensurate with said value over a line-of-sight distance;
 (d) a communications module physically separate from said sensor module, mounted upon, and at the voltage potential of, an energized power conductor within line-of-sight distance from said first location;
 (e) first signal receiving means mounted to said communication module for receiving said first signal;
 (f) second signal transmitting means, at least a portion of said second signal transmitting means being mounted to said communication module, for transmitting a second signal, commensurate with said first signal, over a greater than line-of-sight distance; and
 (g) second signal receiving means at said second location for receiving said second signal.

2. The invention according to claim 1 wherein all power required for operation of said transducer and power supply means, and said first signal transmitting means is derived from said power conductor upon which said sensor module is mounted.

3. The invention according to claim 2 wherein all power required for operation of said first signal receiving means and second signal transmitting means is derived from said power conductor upon which said communications module is mounted.

4. The invention according to claim 3 wherein said second signal transmitting means comprises means for transmitting said second signal to a geosynchronous satellite.

5. The invention according to claim 4 wherein said second signal transmitting means comprises a GOES antenna.

6. The invention according to claim 4 wherein said second signal transmitting means comprises a C-band spread spectrum antenna.

7. The invention according to claim 4 wherein said second signal transmitting means comprises an earth satellite transmit-receive antenna and further including means for mounting said antenna on said communications module, whereby said antenna is at the potential of said power conductor upon which said communications module is mounted.

8. The invention according to claim 7 wherein said antenna mounting means includes means for adjusting the azimuth and elevation angles of said antenna.

9. The invention according to claim 8 wherein said antenna mounting and said adjusting means are configured to be corona-free while at said conductor potential.

10. The invention according to claim 9 wherein said adjusting means is constructed and arranged for manipulation by hot stick tools to effect adjustment of said azimuth and elevation angles.

11. The invention according to claim 1 wherein said second signal transmitting means comprises a fiber optic communications link extending between said first and second locations.

12. The invention according to claim 11 wherein said fiber optic link comprises at least one fiber optic cable supported over at least a portion of its length by support means mountable directly upon an energized high voltage conductor.

13. The invention according to claim 12 wherein said sensor module is generally toroidal and said support means is constructed and arranged for operation by a hot stick tool.

14. The invention according to claim 13 and further including a slice box including a housing of generally toroidal configuration mounted to, and thus at said high voltage potential of, said conductor in surrounding relation thereto.

15. The invention according to claim 14 wherein said fiber optic cable includes a plurality of spliced, individual, buffer tubes, and said splice box includes a sealed enclosure for said buffer tubes.

16. The invention according to claim 15 wherein sad fiber optic cable includes drop and insert cables spliced to said buffer tubes within said sealed enclosure, and further including moisture proof entry ports through which said drop and insert cables pass to the interior of said splice box.

* * * * *